(12) United States Patent
Ueno et al.

(10) Patent No.: US 7,925,843 B2
(45) Date of Patent: Apr. 12, 2011

(54) MEMORY CONTROLLER HAVING A PLURALITY OF MEMORY REGIONS FOR PROTECTION AGAINST POWER FAILURE

(75) Inventors: Keizo Ueno, Hyogo (JP); Masaki Okamoto, Hyogo (JP)

(73) Assignee: Fujitsu Limited, Kawasaki (JP)

( * ) Notice: Subject to any disclaimer, the term of this patent is extended or adjusted under 35 U.S.C. 154(b) by 175 days.

(21) Appl. No.: 11/032,213

(22) Filed: Jan. 11, 2005

(65) Prior Publication Data
US 2005/0122790 A1 Jun. 9, 2005

Related U.S. Application Data

(63) Continuation of application No. PCT/JP03/00572, filed on Jan. 22, 2003.

(51) Int. Cl.
*G06F 13/14* (2006.01)
(52) U.S. Cl. ............ 711/154; 711/133; 711/162; 714/6; 714/54; 714/758
(58) Field of Classification Search .................. 711/154, 711/133, 162; 714/6, 54, 758
See application file for complete search history.

(56) References Cited

U.S. PATENT DOCUMENTS

| | | | | |
|---|---|---|---|---|
| 5,079,715 A | * | 1/1992 | Venkataraman et al. | 702/62 |
| 6,035,413 A | * | 3/2000 | Kubota et al. | 714/6 |
| 6,327,186 B1 | * | 12/2001 | Fukuoka | 365/185.26 |
| 6,385,746 B1 | * | 5/2002 | Tatsumi | 714/718 |
| 6,438,052 B1 | * | 8/2002 | Sekine | 365/149 |
| 6,731,563 B1 | * | 5/2004 | Yokoyama et al. | 365/228 |
| 2004/0030837 A1 | * | 2/2004 | Geiner et al. | 711/133 |
| 2004/0193967 A1 | * | 9/2004 | Nicolaidis | 714/54 |

FOREIGN PATENT DOCUMENTS

| | | |
|---|---|---|
| JP | 03-250347 | 11/1991 |
| JP | 05-143468 | 6/1993 |
| JP | 07-248978 | 9/1995 |
| JP | 07248978 A * | 9/1995 |
| JP | 09-293028 | 11/1997 |
| JP | 2002-297458 | 10/2002 |

OTHER PUBLICATIONS

International Search Report for International Application PCT/JP03/00572, mailed May 13, 2003.

* cited by examiner

*Primary Examiner* — Yong Choe
(74) *Attorney, Agent, or Firm* — Staas & Halsey LLP

(57) ABSTRACT

A memory controller (1) writes data continuously to a first and a second blocks (20A), (20B) which are provided by dividing a memory region of a nonvolatile memory (2), and reads the data therefrom. The controller includes: a first writer (12A) which writes data to the first block (20A); and a second writer (12B) which writes data to the second block (20B) after completion of the writing by the first writer (12A) and a lapse of a waiting time generally equal to a length of time necessary for a power breakdown to drop a power source voltage down to a voltage value to at least disable the writing of data to the memory region.

8 Claims, 7 Drawing Sheets

MEMORY CONTROLLER HAVING A PLURALITY OF MEMORY REGIONS FOR PROTECTION AGAINST POWER FAILURE

This application is a continuing application, filed under 35 U.S.C. §111(a), of International Application PCT/JP03/00572, filed Jan. 22, 2003.

TECHNICAL FIELD

The present invention relates to a memory controller which makes access to nonvolatile memories such as Electrically Erasable Programmable Read-Only Memory or EEPROMs

BACKGROUND ART

Access procedures to nonvolatile EEPROMs are different from those to volatile Random Access Memories, or RAMs, and has a level of redundancy in order to assure that as much valid data as possible can be read out even if the data is destroyed by e.g. power failure while the data is being written.

For example, JP-A 9-293028 discloses one of such access procedures. According to this procedure, when writing a data to an EEPROM, a set of the data (backup data) and a mirror data created by inverting the bits of the data is written in a first memory region. Following this step, the same set of the backup data and the mirror data is written in a second memory region which is away from the first region by a predetermined address. According to this procedure, when reading the data from the EEPROM, first, the backup data and the mirror data from the first memory region are compared with each other. If an error is detected from the comparison, the backup data and the mirror data from the second memory region are compared. If the comparison suggests that the data from the second memory region is valid, the data from the second memory region can be read out for output.

Another example of the access procedure is disclosed in JP-A5-143468. According to this procedure, a first and a second memory regions (memory areas) are defined in an EEPROM. Firstly, the data and error correction codes are written in the first memory region. When the data is updated, the updated data and error correction codes are written in the second memory region. When the data is updated next time, the data and the error correction codes in the first memory region are overwritten. Likewise, in the next data update, the data and the error correction codes in the second memory region is overwritten. In other words, data writing is made alternately to the first and the second memory regions. According to this method, when data is read out from the EEPROM, the latest data and the error correction codes are read out from e.g. the second memory region. If verification using the error correction codes suggests that there is an error in the latest data which is read out, the old data which was updated earlier can be read out and outputted from the first memory region.

However, according to whichever of the methods described above, whether data is written to the first and the second memory regions sequentially or alternately, there is still a chance for a write failure occurring both in the first and the second memory regions if the power is turned off while the data is being written continuously from the first to the second region. This write failure occurs because a power breakdown does not result in an immediate loss of the power source voltage, but the voltage drops gradually, which sustain the writing operation for a period of time due to a fadeout effect. For this reason, write failure can occur in both of the two identical data or both of the two old and new data which are being written in the two different regions, i.e. the first and the second, memory regions, leading to a problem that no valid data is available after the power is restored.

DISCLOSURE OF THE INVENTION

An object of the present invention is to provide a memory controller which is capable of reading valid data as much as possible even if the power fails during the data writing operation over the first to the second memory regions.

The present invention provides a memory controller which writes data continuously to a first and a second blocks provided by dividing a memory region of a nonvolatile memory, and reads the data therefrom. The memory controller includes a first writer for writing data to the first block and a second writer for writing data to the second block after completion of the writing by the first writer and a lapse of a waiting time. The waiting time is generally equal to a length of time necessary for a power breakdown to drop a power source voltage down to a voltage value at least to disable the writing of data to the memory region.

As a preferred mode of embodiment, the memory controller further includes a check code generator for generating error detection check codes upon writing of data to each of the first and the second blocks. The first and the second writers write the check codes to each of the first and the second blocks.

As a preferred mode of embodiment, the memory controller further includes: an error detector for detecting an error based on the stored data and the check codes, for each of the first and the second blocks upon reading the data from the memory region; and a reader. The reader reads the data and the check codes from the first block and outputs the data read from the first block if there is no error detected by the error detector. The reader reads the data and the check codes from the second block if an error is detected, and outputs the data read from the second block if no error is detected by the error detector.

As a preferred mode of embodiment, the reader outputs a stored default data if an error is found in both of the first and the second blocks.

As a preferred mode of embodiment, the memory controller according to claim 5, further includes: an Exclusive OR (EOR) operator for calculating an EOR for a pair of mutually corresponding data stored in the first and the second blocks upon reading the data from the memory region; and a reader. The reader reads the pair of mutually corresponding data from the first and the second blocks and outputs the data read from the first or the second block if a value 1 is obtained as a result of the EOR operation performed by the EOR operator.

As a preferred mode of embodiment, the memory controller according to claim 5, further includes: an EOR operator for calculating an EOR for a pair of mutually corresponding data stored in the first and the second blocks upon reading the data from the memory region; and a reader. The reader reads the pair of mutually corresponding data from the first and the second blocks and outputs the data read from the first or the second block if a value 1 is obtained as a result of the EOR operation performed by the EOR operator.

As a preferred mode of embodiment, the reader outputs a stored default data if a result of the EOR operation performed by the EOR operator is a value 0.

Other characteristics and advantages of the present invention will become clearer from a detailed description to be made hereafter with reference to the drawings.

BEST MODE FOR CARRYING OUT THE INVENTION

Figure 1:
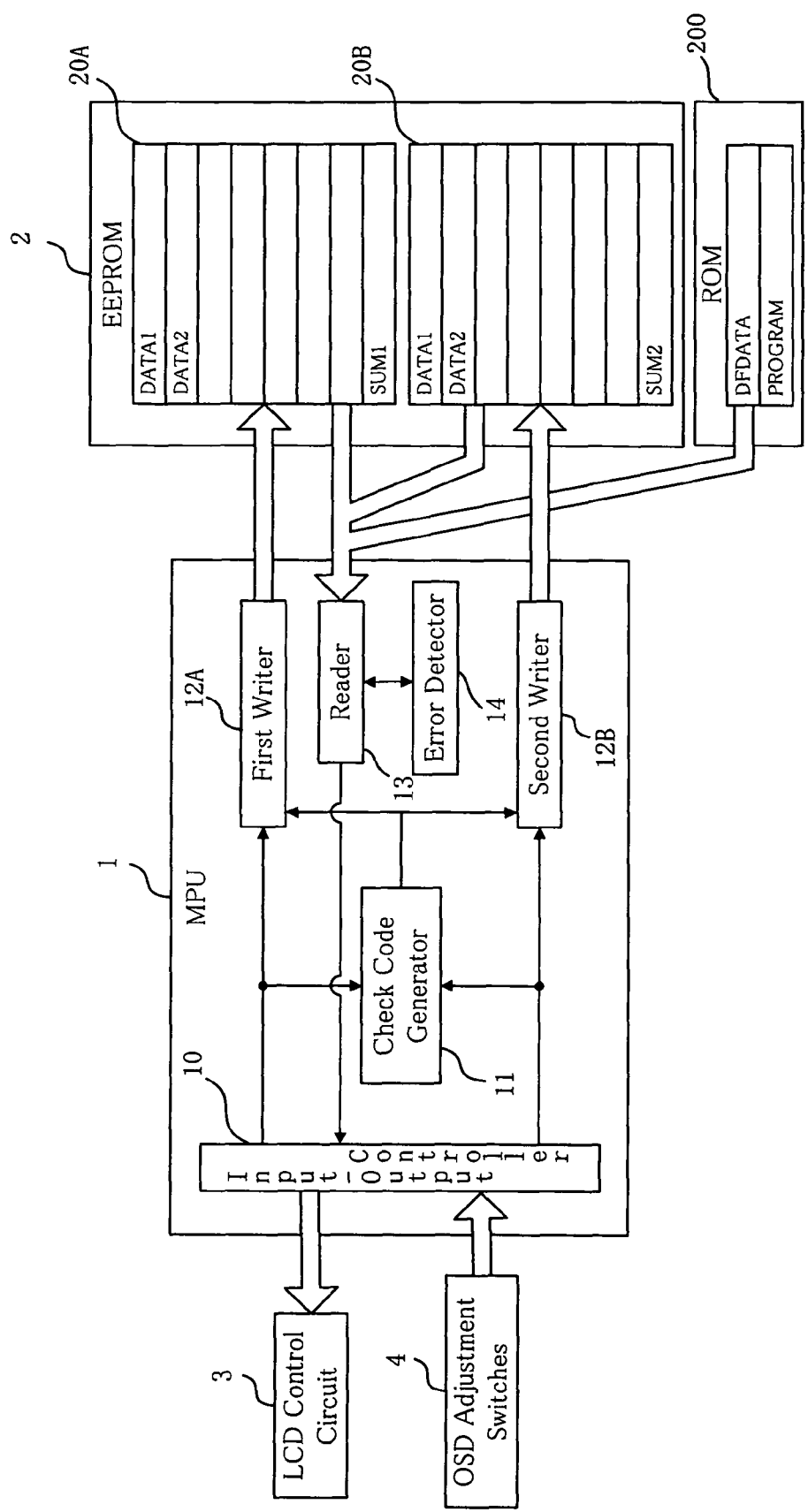
FIG. 1 is a block diagram showing an embodiment of the present invention.

FIG. 1 is a block diagram showing an embodiment of the present invention. The present embodiment uses a liquid crystal display for a personal computer as an example. The liquid crystal display includes: an Microprocessor unit, or MPU, 1 which makes superimposing display of such information as brightness and contrast, on the screen as part of OSD (On-Screen Display) functions; an EEPROM 2 which stores adjustment data concerning OSD adjustment items, a Read Only Memory, or ROM, 200 which stores an executable program for the MPU 1, a liquid crystal display, or LCD, control circuit 3 which controls the liquid crystal screen, OSD adjustment switches 4, and so on. The MPU 1, the EEPROM 2, and the ROM 200 are interconnected via an internal bus. The MPU 1 is connected with the LCD control circuit 3 and OSD adjustment switches 4 via an interface circuit and so on which are not illustrated in the figure.

The MPU 1 includes such functional blocks, which serve as part of a memory controller, as an input-output controller 10, a check code generator 11, a first and a second writers 12A, 12B, a reader 13, and an error detector 14. Memory region of the EEPROM 2 has two blocks or a first block 20A and a second block 20A each serving as an address space in which the above-mentioned adjustment data can be written. The ROM 200 stores a default data about the OSD adjustment items.

The LCD control circuit 3 controls the state of liquid crystal screen and displays the OSD adjustment items as a superimposed image on the screen, in accordance with control signals outputted from the MPU 1 via the input-output controller 10. The OSD adjustment switches 4 serve as operating means for the user to input or change values of the OSD adjustment items. Operation information of the OSD adjustment switches 4 (data concerning the OSD adjustment items) is inputted to the MPU 1 via the input-output controller 10. The data concerning the OSD adjustment items (the adjustment data) which is inputted to the MPU 1 is written to the first block 20A of the EEPROM 2 by the first writer 12A, and to the second block 20B of the EEPROM 2 by the second writer 12B. As for the control when the data concerning the OSD adjustment items is written to the EEPROM 2, description will be made later.

The input-output controller 10 of the MPU 1 controls signal input and output among the MPU 1, the LCD control circuit 3 and the OSD adjustment switches 4. The check code generator 11 calculates checksums when the adjustment data is written to the first and the second blocks 20A, 20B, by using the data to be written and another data.

The first writer 12A writes values of the adjustment data and the checksums calculated by the check code generator 11, in the first block 20A. After the first writer 12A has completed its writing operation for the values of the adjustment data and the checksums to the first block 20A, and a predetermined waiting time which will be described later has elapsed, the second writer 12B writes to the second block 20B the same values of the adjustment data and the same checksums as written to the first block 20A by the first writer 12A. In other words, the first and the second blocks 20A, 20B normally store the same adjustment data.

The reader 13 reads out the values of adjustment data and the checksums from the EEPROM 2. The error detector 14 calculates checksums from the values of adjustment data read by the reader 13 from each of the first and the second blocks 20A, 20B, and compares these checksums (hereinafter called current checksums) with the checksums which were read by the reader 13 from each of the first and the second blocks 20A, 20B (hereinafter called original checksums). If the calculated current checksums are not identical with the original checksums, the error detector determines that an error has occurred whereas it determines that the data is valid if the two kinds of checksums are identical with each other.

The reader 13 first reads all values of the adjustment data and their checksums stored in the first block 20A. If the error detector 14 determines the values of these adjustment data are valid, the values of the adjustment data are inputted to the LCD control circuit 3 via the input-output controller 10. On the other hand, if the error detector 14 determines that errors are included in the values of adjustment data, the reader 13 then reads all values of the adjustment data and their checksums stored in the second block 20B. If the error detector 14 determines that the values of these adjustment data are valid, the values of the adjustment data are inputted to the LCD control circuit 3 via the input-output controller 10. On the other hand, if the error detector 14 determines that errors are included in the values of the adjustment data, the reader 13 finally reads the default data from the ROM 200, and inputs the default data to the LCD control circuit 3 via the input-output controller 10. Thus, the LCD control circuit 3 performs automatic adjustment on brightness, contrast and so on of the liquid crystal screen, based on the inputted adjustment data.

With the above arrangement, upon turning on the power to the liquid crystal display for example, the display screen is adjusted in accordance with the memory stored in the EEPROM 2. Also, right after the user operates the OSD adjustment switches 4, the OSD adjustment items such as brightness and contrast are superimposed on the display screen.

Figure 2:
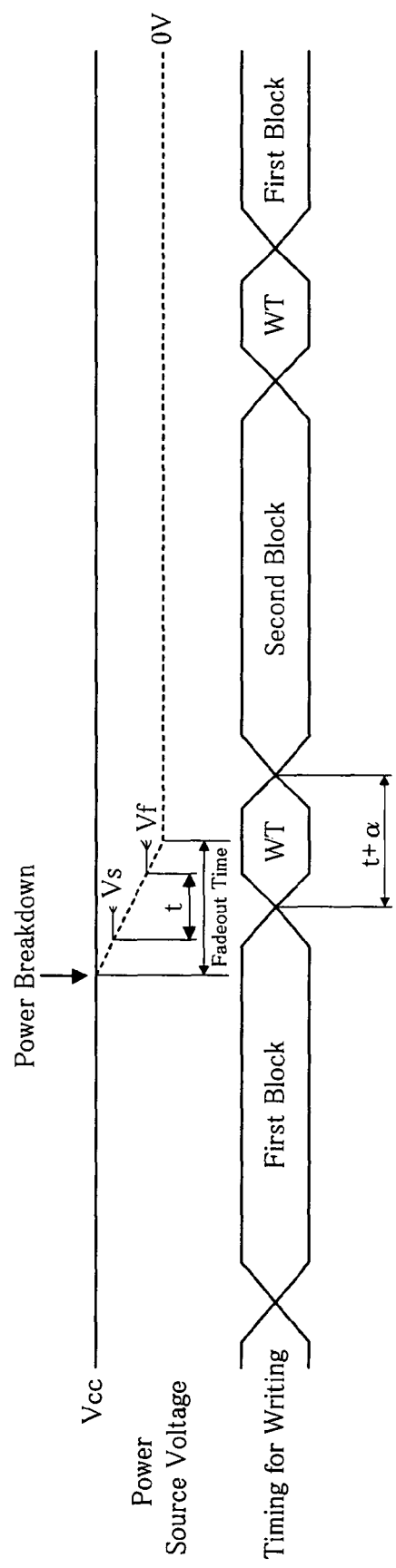
FIG. 2 is a timing chart for describing a relationship between a power source voltage and a data writing timing.

FIG. 2 is a timing chart for describing a relationship between the power source voltage and the timing for writing data. The power source voltage Vcc is normally maintained at a constant level as indicated by a solid line. The MPU 1 writes the adjustment data to the first block 20A while the power source voltage Vcc is at the constant level, and then after a waiting time WT has elapsed, writes the same adjustment data to the second block 20B. If it is necessary to continue to write another adjustment data, the MPU waits again for the waiting time WT, then writes this another adjustment data to the first block 20A, then waits again for the waiting time WT, and then writes the same another adjustment data into the second block 20B.

Now, there can be a case that the power source voltage Vcc is cut off all of a sudden, by an abrupt turning off of the power. In such an occasion, the power source voltage Vcc does not drop at once, but decreases gradually as indicated by a broken line in FIG. 2. During this time, writing operation can occur due to a fadeout effect. Specifically, until the power source voltage Vcc has come below a guaranteed writing level Vs, writing operation is performed just a little but properly. Writing operation becomes unstable in the range from the guaranteed writing level Vs to a disabled writing level Vf, and finally, when the power source voltage Vcc comes below the disabled writing level Vf and down to 0, the writing operation ceases completely. As described, there is a period of time when the power source voltage Vcc decreases from the normal constant level to 0, which is called fadeout time. Data which is written during the fadeout time, or the period of time when the power source voltage Vcc decreases from the guaranteed writing level Vs to 0 contains errors.

In view of this, the waiting time WT which is taken after the writing is finished in the first block 20A and before writing can begin in the second block 20B is set to be slightly longer than a period of time t in which the power source voltage Vcc can drop from the guaranteed writing level Vs down to the disabled writing level Vf, i.e. WT is set to be t+α. The waiting time WT as such is predetermined through simulations for example, and the length of the time t+α is generally as long as the fadeout time which is e.g. in the order of millisecond.

It should be noted here that a hardware circuit may be incorporated for measurement of the time t upon the power breakdown or the period of time it takes for the power source voltage Vcc to drop from the guaranteed writing level Vs down to the disabled writing level Vf. The circuit measures the time t or the period of time it takes for the power source voltage Vcc to drop from the guaranteed writing level Vs down to the disabled writing level Vf every time a power breakdown occurs, and the result of measurement will be used for setting the waiting time WT until the next power breakdown occurs. In this case, the initial waiting time WT which is set when the product is manufactured is a default time.

As exemplified in FIG. 2, if the power breakdown occurs during the time when the writing space for an adjustment data is being changed from the first block 20A to the second block 20B, there is a possibility that the adjustment data which has been written in the first block 20A contains errors. On the other hand, by the time the same adjustment data as has been written in the first block 20A is to be written to the second block 20B, already, the waiting time WT has passed and therefore it is impossible to write the data. Thus, the second block 20B stores the existing or old adjustment data which was written before the power breakdown.

After the power is restored, when the user for example operates the OSD adjustment switches 4, first, all adjustment data and checksums are read from the first block 20A, and current checksums are calculated from all the read adjustment data. At this time, since the adjustment data from the first block 20A includes errors due to the write failure, the check-up process of comparing the original checksums with the current checksums finds disagreement between the checksums. Then next, all adjustment data and checksums are read from the second block 20B, and current checksums are calculated from all the read adjustment data. At this time, the adjustment data from the second block 20B is all valid although the data is an old one before the power breakdown. Thus, the check-up process of comparing the original checksums with the current checksums will find all the checksums agree with each other. Then, from all of the adjustment data read from the second block 20B, necessary adjustment data related to the user's operation on the OSD adjustment switches 4 is picked and outputted to the LCD control circuit 3. Thus, old settings for the OSD adjustment items which were made before the power breakdown and different from the settings being written at the time of the power breakdown are displayed on the screen as a superimposition.

Figure 3:
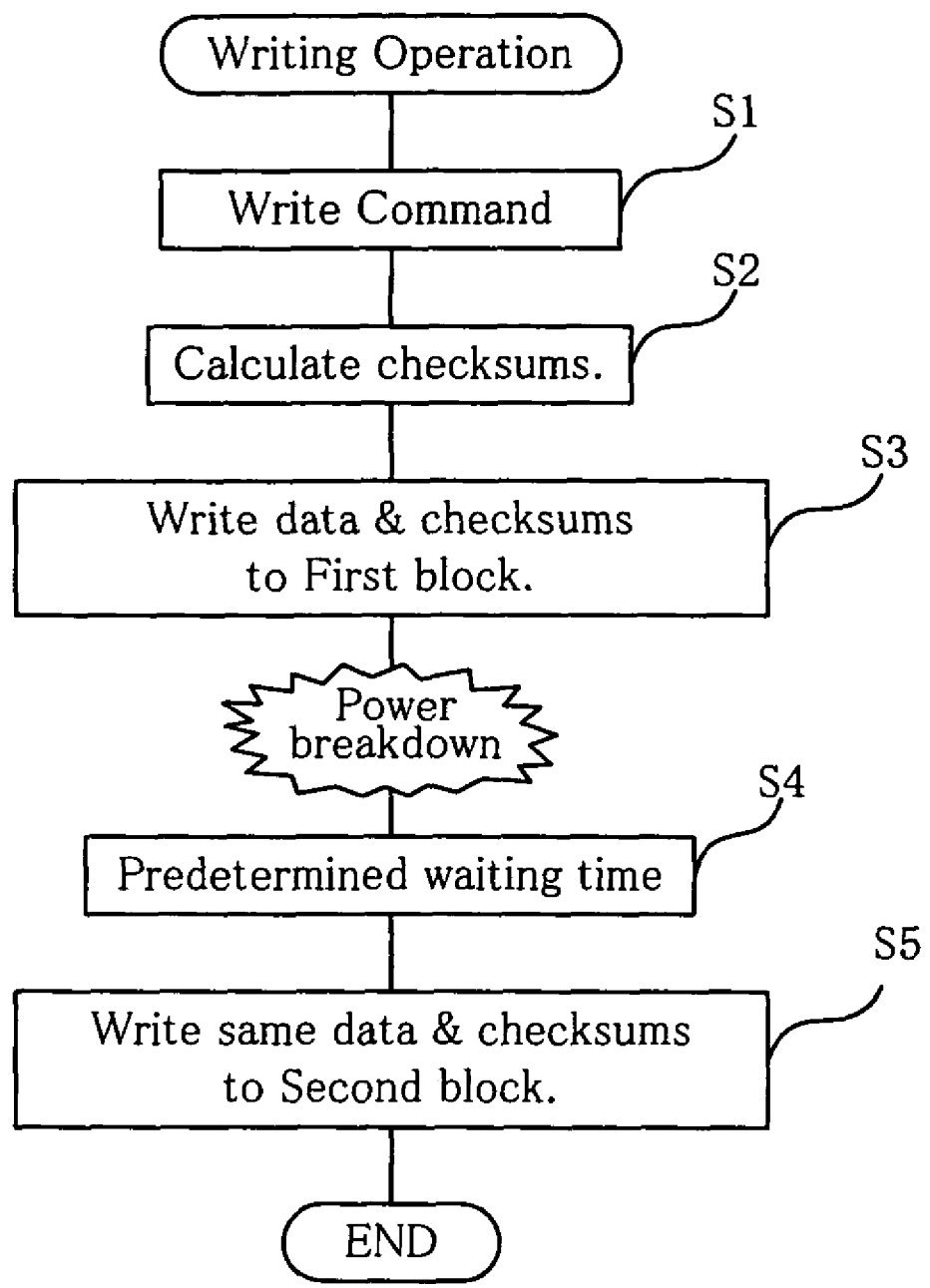
FIG. 3 is a flowchart showing a writing operation.
Figure 4:
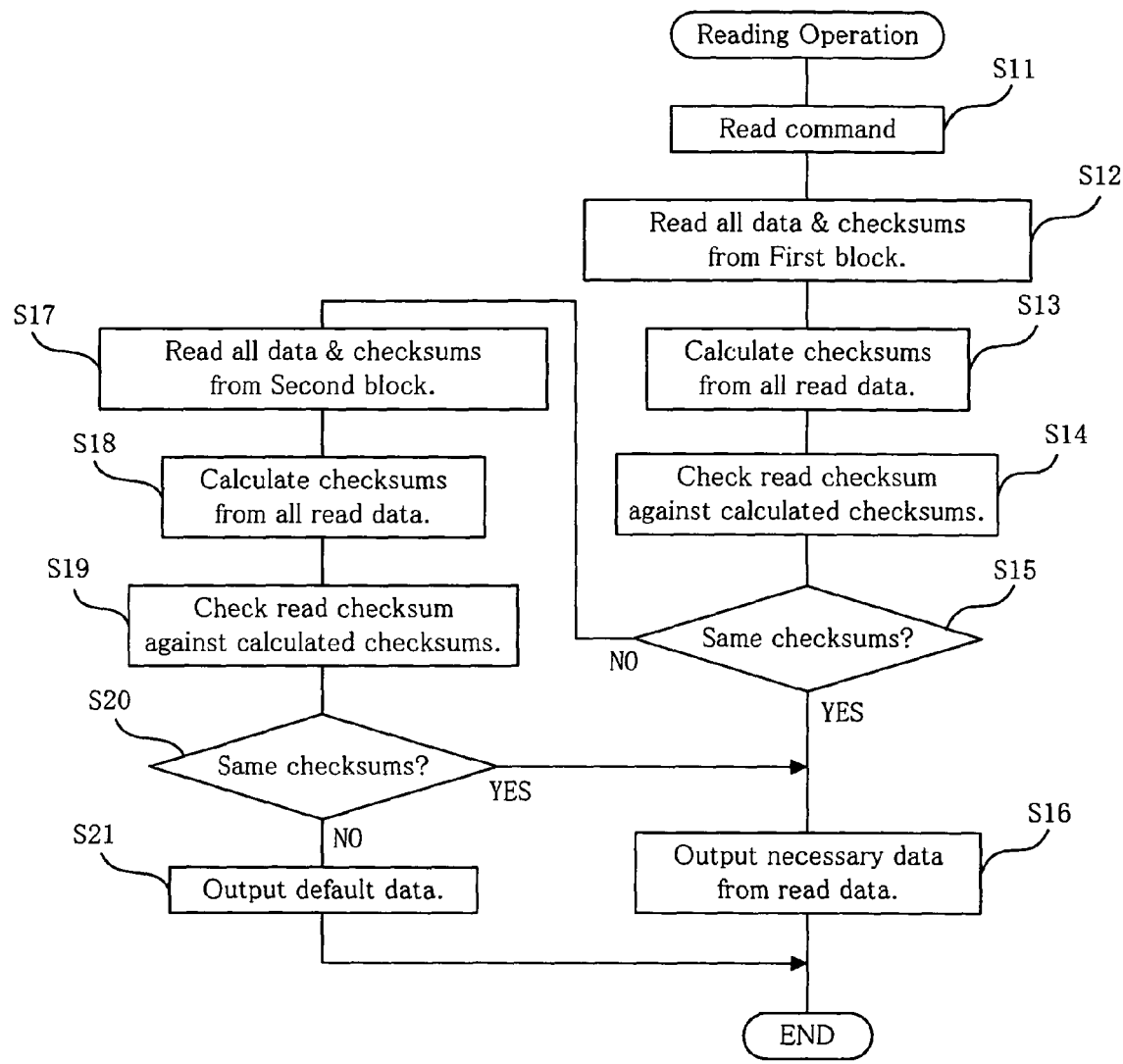
FIG. 4 is a flowchart showing a reading operation.

FIG. 3 is a flowchart showing the writing operation, and FIG. 4 is a flowchart showing the reading operation. As shown in FIG. 3, upon receiving a command to write adjustment data to the EEPROM 2, from the user through operation on the OSD adjustment switches 4 (S1), the MPU 1 re-calculates checksums in the first block 20A, including values of the updated adjustment data (S2).

Thereafter, the MPU 1 writes the necessary values of the adjustment data and the checksums to the first block 20A (S3) It should be noted that alternatively, the necessary values of the adjustment data may be written to the first block 20A before re-calculation and entering of the checksums in the first block 20A.

After the writing operation to the first block 20A is complete, and when a predetermined waiting time WT has passed (S4), the MPU 1 writes the same values of adjustment data and their checksums as has been written to the first block 20A, to the second block 20B (S5). This time again, the necessary values of the adjustment data may be written to the second block 20B before re-calculation and entering of the checksums in the second block 20B.

In other words, as far as the writing operation is performed normally, exactly the same adjustment data is written to the first and the second blocks 20A, 20B. On the other hand, as exemplified in FIG. 3, when a power breakdown occurs between a time when a writing operation is being made to the first block 20A till the waiting time WT has been passed (See the power breakdown case between Step S3 and Step S4), write failure can occur in the first block 20A, yet no writing operation is made to the second block 20B. As a result, the first block 20A will contain the adjustment data which may contain the write failure whereas the second block 20B contains valid adjustment data before the writing operation. Likewise, although not specifically illustrated, if writing operation to the first block 20A is complete normally and then power breakdown occurs while writing in the second block 20B, the first block 20A contains the latest adjustment data which is valid whereas the second block 20B contains adjustment data with the write failure. In other words, write failure caused by power breakdown can occur only in one of the first and the second blocks 20A, 20B, and there is very little possibility that both of the first and the second blocks 20A, 20B are affected. However, other malfunctions than power breakdown can cause write failure in both of the first and the second blocks 20A, 20B.

As shown in FIG. 4, upon receiving a command to read adjustment data, from the user through operation on the OSD adjustment switches 4 (S11), the MPU 1 reads all values of the adjustment data and their checksums from the first block 20A (S12).

The MPU 1 calculates checksums based on the values of the read adjustment data (S13).

The MPU 1 compares the original checksums which are read out with the current checksums which are freshly calculated (S14), and if they agree with each other, (S15: YES), the MPU picks up necessary adjustment data from the read adjustment data, and outputs the values of these adjustment data to the LCD control circuit 3 (S16).

If Step S15 finds disagreement in the checksum values (S15: NO), the MPU 1, reads all values of the adjustment data and their checksums from the second block 20B (S17).

The MPU 1 calculates checksums of the adjustment data read from the second block 20B (S18).

The MPU 1 compares the original checksums which are read out with the current checksums which are freshly calculated (S19), and if they agree with each other, (S20: YES), the MPU picks up necessary adjustment data from the read adjustment data, and outputs the values of these adjustment data to the LCD control circuit 3 (S16).

If Step S20 finds disagreement in the checksum values (S20: NO), the MPU 1 reads default data representing the necessary adjustment data from the ROM 200, and outputs values of the default data to the LCD control circuit 3, and finishes the reading operation (S21).

Therefore, according to the present embodiment, even if a power breakdown occurs during the time when the writing space for the adjustment data is being changed from the first block 20A to the second block 20B or from the second block 20B to the first block 20A, there is no possibility that write failure occurs in both of the first and the second blocks 20A, 20B. Even if the writing operation fails in the first block 20A, it is still possible, once the power is restored, to read old valid data which was written before the power breakdown, from the second block 20B, enabling to read as latest available data as possible. Obviously, even if the writing operation fails in the second block 20B, it is still possible, once the power is restored, to read the newest valid data which was written before the power breakdown, from the first block 20A.

Next, another embodiment will be described.

Figure 5:
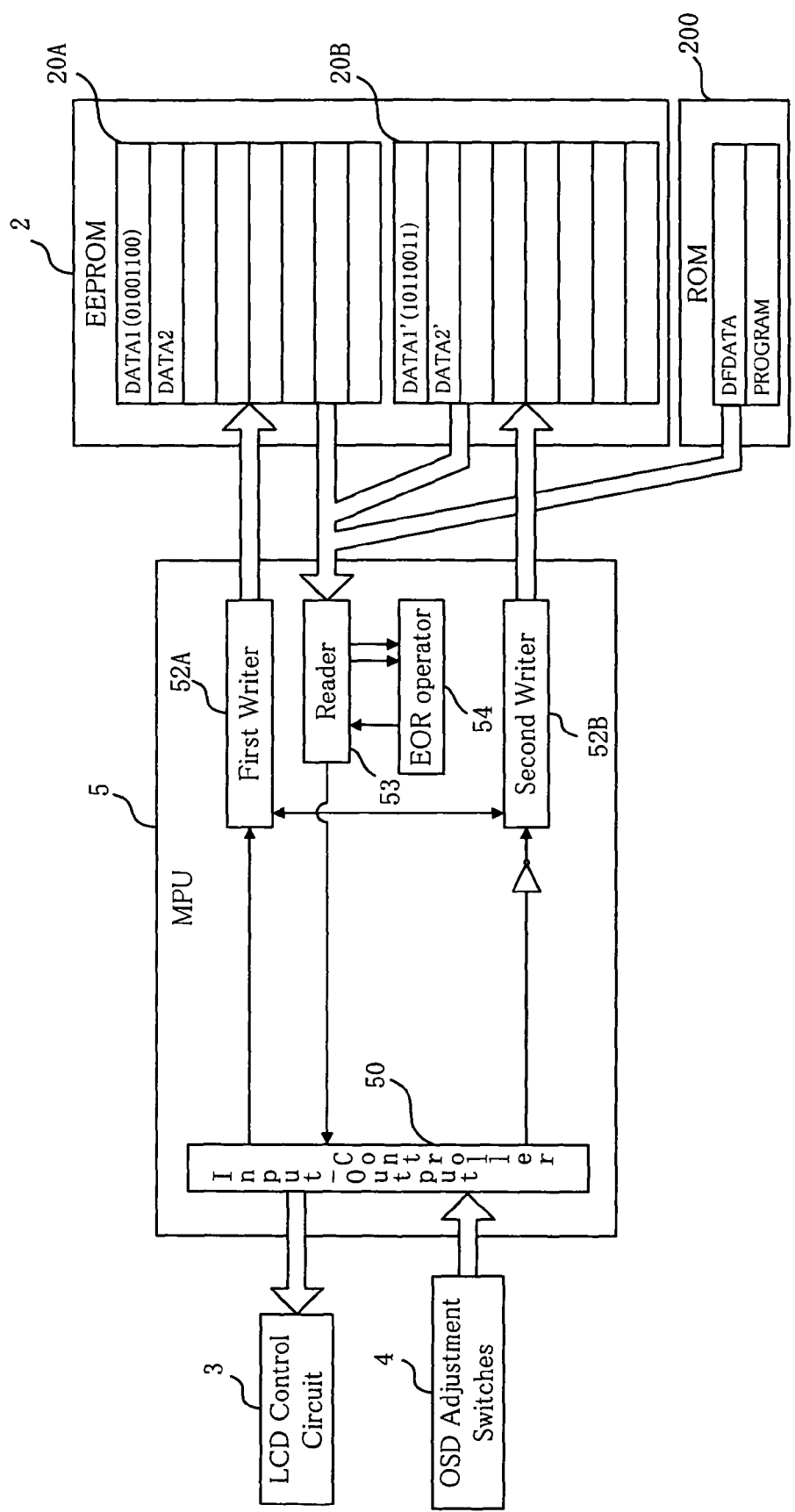
FIG. 5 is a block diagram showing another embodiment of the present invention.

FIG. 5 is a block diagram showing another embodiment of the present invention. Note that arrangements which are the same as the previous embodiment will not be described again here.

An MPU 5 according to this embodiment includes such functional blocks, which serve as part of a memory controller, as an input-output controller 50, a first and a second writers 52A, 52A, a reader 53, and an EOR operator 54. As in the previous embodiment, memory region of an EEPROM 2 has two blocks or a first and a second blocks 20A, 20B each serving as an address space in which the above-mentioned adjustment data can be written. A ROM 200 stores a default data about the OSD adjustment items.

In the MPU 5, the first writer 52A writes adjustment data directly in the form of bit values in the first block 20A. After the first writer 52A completes its writing operation, and a waiting time WT has passed as in the previous embodiment, the second writer 52B, writes the same adjustment data as has been written by the first writer 52A, in the form of reversed bit values in the second block 20B. Specifically, if a four-bit data "0101" for example was written in the first block 20A, the second block 20B will store a four-bit data "1010", i.e. each binary value at each digit in the four-bit data is inverted. In other words, the first and the second blocks 20A, 20B store different sets of bit values of exactly the same adjustment data relating to the same object.

The reader 53 reads bit values of necessary adjustment data from both of the first and the second blocks 20A, 20B, and only upon finding an error, reads the default data from the ROM 200. The read data is inputted to an LCD control circuit 3 via the input-output controller 50. The EOR operator 54 makes exclusive OR operation for each pair of the corresponding bits from the data read from the first and the second blocks 20A, 20B, and determines that there is an error if the operation gives a 0 result whereas it determines that the data is valid if the operation gives a 1 result.

In this embodiment, too, in view of the possible power breakdown which can occur at the timing as shown in FIG. 2, a waiting time WT is taken after the writing is finished at the first block 20A before writing can begin at the second block 20B. Therefore, if a power breakdown occurs, errors can occur in either of the adjustment data written in the first and the second blocks 20B, 20A, yet there is no error in the other adjustment data which has been written to the first and the second blocks 20A, 20B before the power breakdown.

After the power is restored, when the user for example operates the OSD adjustment switches 4, reading is made from both of the first and the second blocks 20A, 20B for bit values of the same adjustment data, and EOR operations are made for these bit values. If one of the first and the second blocks 20A, 20B contains adjustment data which includes write failure, the EOR operation for this data gives a 0 result, upon which the default data is read from the ROM 200, and written to both of the blocks 20A, 20A, as well as outputted to the LCD control circuit 3. On the other hand, if the adjustment data is written properly before the power breakdown, the EOR operation gives a 1 result, upon which the values from e.g. the first block 20A are outputted to LCD control circuit 3. As a result, values for the OSD adjustment items which were being changed at the time of power breakdown are lost and returned to the default values, yet values for the OSD adjustment items which were changed before the power breakdown are intact, and the updated values are displayed in superimposition.

Figure 6:
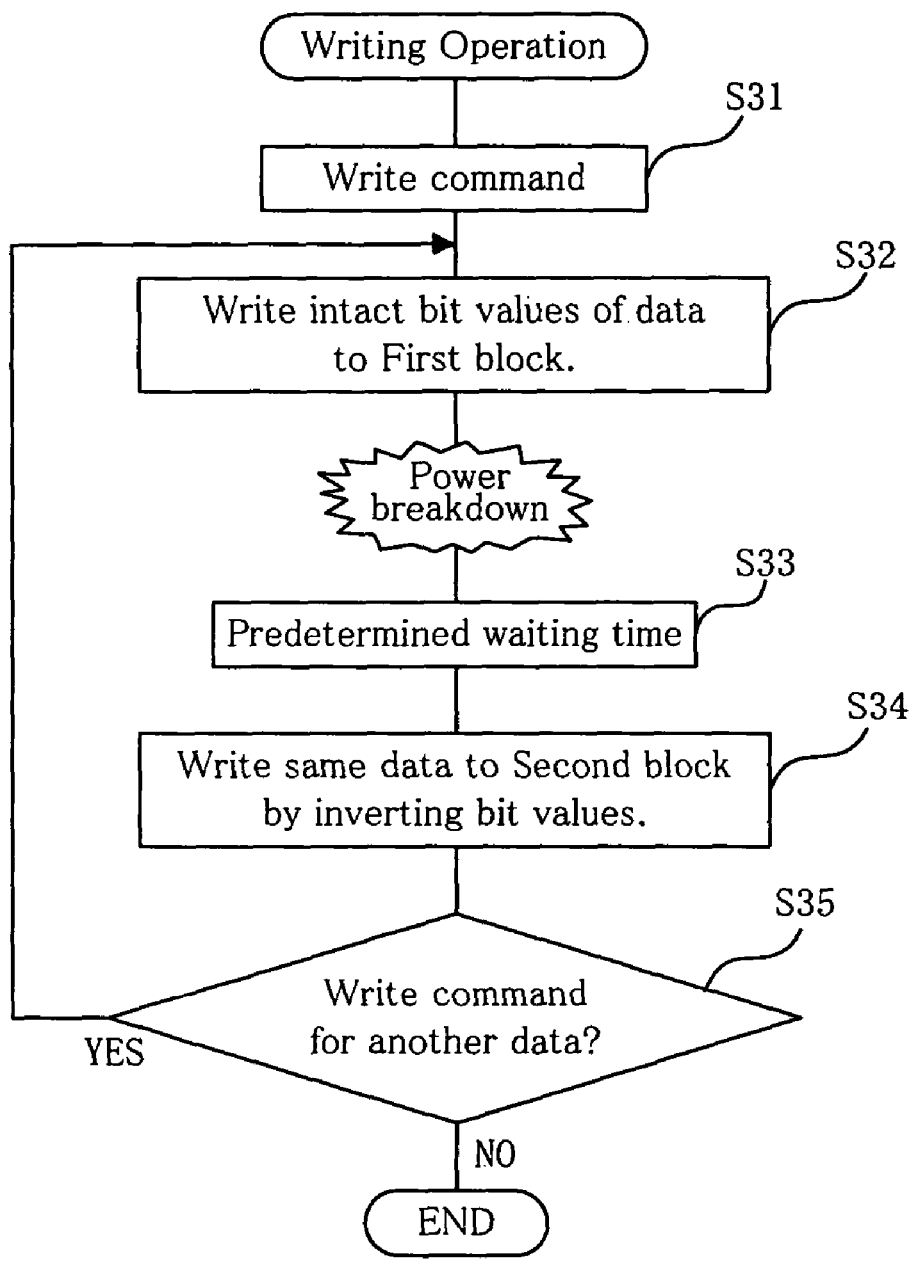
FIG. 6 is a flowchart showing a writing operation according to the other embodiment.
Figure 7:
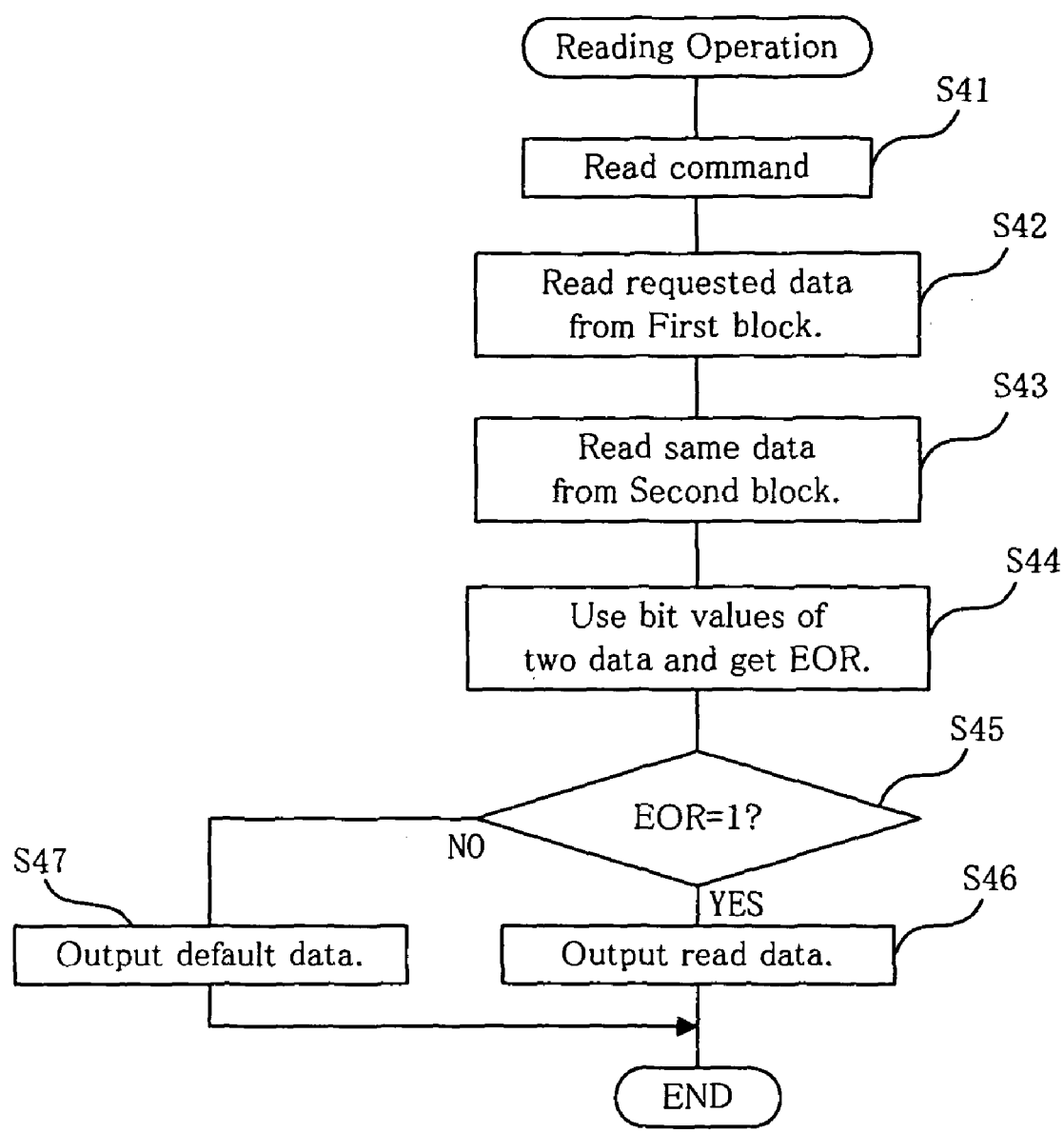
FIG. 7 is a flowchart showing a reading operation according to the other embodiment.

FIG. 6 is a flowchart showing the writing operation according to this embodiment, and FIG. 7 is a flowchart showing the reading operation according to this embodiment. As shown in FIG. 6, upon receiving a command to write adjustment data into the EEPROM 2, from the user through operation on the OSD adjustment switches 4 (S31), the MPU 5 simply writes bit values of the adjustment data in the first block 20A (S32).

After the writing operation into the first block 20A is complete, and in a predetermined waiting time WT (S33), the MPU 5 creates data by inverting each bit value of the same adjustment data as has been written to the first block 20A, and write these inverted bits in the second block 20B (S34).

If there is no more writing command relating to adjustment data (S35: NO), the MPU 5 finishes the writing operation. If there is more writing commands relating to adjustment data (S35: YES), the MPU 5 brings the writing operation back to Step S32.

In other words, as far as the writing operation is performed normally, the same adjustment data is written to the first and the second blocks 20A, 20B, in inversed bit values from each other. On the other hand, as exemplified in FIG. 6, when a power breakdown occurs between a time when a writing operation is being made to the first block 20A till the waiting time WT has been passed (See the power breakdown case between Step S32 and Step S33), write failure can occur in the first block 20A, yet no writing operation is made to the second block 20B. As a result, the first block 20A contains the adjustment data which may contain the write failure whereas the second block 20B contains valid adjustment data which was written before the writing operation in the inverted bit format. Likewise, although not specifically illustrated, if writing operation to the first block 20A is normally completed and then a power breakdown occurs while writing in the second block 20B, the first block 20A contains the latest bit values of adjustment data which are valid whereas the second block 20B contains bit values of the adjustment data affected by the write failure. In other words, write failure caused by power breakdown can occur only in the adjustment data which is then being written and there is very little possibility that both of the adjustment data contain errors.

As shown in FIG. 7, upon receiving a command to read adjustment data, from the user through operation on the OSD adjustment switches 4 (S41), the MPU 5 reads values of the corresponding adjustment data from the first block 20A (S42), as well as values of the corresponding adjustment data from the second block 20B (bit values created by inverting bit values of the adjustment data which are read from the first block 20A; hereinafter called inversed bit values) (S43).

The MPU 5 performs EOR operation for each pair of bit value and inverted bit value from the read adjustment data (S44).

If the EOR operation gives a 1 result (S45: YES), the MPU 5 outputs bit values of the adjustment data read from the first block 20A to the LCD control circuit 3 (S46). Alternatively, the inversed bit values of the adjustment data read from the second block 20B may be inverted further for the output.

If the EOR operation gives a 0 result in Step S45 (S45: NO), the MPU 5 reads default data from ROM 200 for the necessary adjustment data, and outputs these default values to the LCD control circuit 3 before finishing the reading operation (S47).

Therefore, according to this embodiment, if a power breakdown occurs during the time when the writing space for the adjustment data is being changed from the first block 20A to the second block 20B or from the second block 20B to the first block 20A, the adjustment data which was being written at the time of the power breakdown is lost and returned to a default value, because values read from the first and the second blocks 20A, 20B after the power restoration will give a 0 result in the EOR operation. On the other hand, all the other adjustment data which were written before the power breakdown can be readable from the first or the second blocks 20A, 20B. This enables to read as much valid data as possible.

Further, since there is no need to write checksums unlike in the previous embodiment, accordingly more data can be written in the first and the second blocks 20A, 20B.

The present invention is not limited to the embodiment so far described above.

The nonvolatile memory may also be a flash-memory-type EEPROM, a ferromagnetic memory (Fe RAM), a magnetic memory (MRAM) and so on.

The present invention is applicable not only to the liquid crystal display but also systems in general which make use of a nonvolatile memory, such as an internal system of a personal computer.

The check code may not be checksums; alternatively for example, each adjustment data may be given a parity bit, CRC code, hamming code, reed-solomon Code, and so on.

In the latter embodiment described above, bit values of necessary adjustment data are overwritten in both of the first and the second blocks 20A, 20B. Alternatively, the older data which is to be overwritten may be kept intact in the first and the second blocks 20A, 20B, until for example, writing operation in the second block 20B is complete, and the old data is disposed thereafter. In such a case, it becomes possible to read the old data even if the updated adjustment data contains error, before resorting to the default value.

Obviously, the readable/writable address space in the EEPROM 2 may be divided into three or more blocks, and the same data may be written in each of the blocks. In this case, there should be the same arrangement as in the above embodiments that writing in the next block is only possible after the waiting time WT has passed.

The invention claimed is:

1. A memory controller for writing data continuously to a first and a second block provided by dividing a memory region of a nonvolatile memory, and for reading the data therefrom, comprising:
a first writer writing data to the first block of said memory while a power source voltage is maintained at a constant level;
a second writer writing the same data to the second block of said same memory as the data written to the first block, while the power source voltage is maintained at the constant level, after completion of the writing by the first writer and a lapse of a predetermined waiting time, the waiting time being longer than a period of time in which the power source voltage drops from a guaranteed writing level down to a disabled writing level disabling the writing of data to the memory region; and
a check code generator generating error detection check codes upon writing of data to each of the first and the second blocks, the first and the second writers writing the check codes to each of the first and the second blocks.

2. The memory controller according to claim 1, further comprising: an error detector for detecting an error based on the stored data and the check codes, for each of the first and the second blocks upon reading the data from the memory region; and a reader for reading the data and the check codes from the first block and outputting the data read from the first block upon detection of no error by the error detector while reading the data and the check codes from the second block upon detection of an error and outputting the data read from the second block upon detection of no error by the error detector.

3. The memory controller according to claim 2, wherein the reader outputs a stored default data if an error is found in both of the first and the second blocks.

4. The memory controller according to claim 1, wherein the data stored in the memory region is binary data, the first writer writing the data as intact to the first block, the second writer writing to the second block a data obtained by inverting each of the binary values of the data written by the first writer to the first block.

5. The memory controller according to claim 4, further comprising: an Exclusive OR (EOR) operator for calculating an EOR for a pair of mutually corresponding data stored in the first and the second blocks upon reading the data from the memory region; and a reader for reading the pair of mutually corresponding data from the first and the second blocks and outputting the data read from the first or the second block upon obtainment of a value 1 as a result of the EOR operation performed by the EOR operator.

6. The memory controller according to claim 5, wherein the reader outputs a stored default data if a result of the EOR operation performed by the EOR operator is a value 0.

7. A memory controller for writing data continuously to a first and a second block provided by dividing a memory region of a nonvolatile memory, and for reading the data therefrom, comprising:
a first writer writing data to the first block while a power source voltage is maintained at a constant level;
a second writer writing the same data to the second block as the data written to the first block, while the power source voltage is maintained at the constant level, after completion of the writing by the first writer and a lapse of a predetermined waiting time, the waiting time being longer than a period of time in which the power source voltage drops from a guaranteed writing level down to a disabled writing level disabling the writing of data to the memory region; and
a check code generator for generating error detection check codes upon writing of data to each of the first and the second blocks, the first and the second writers writing the check codes to each of the first and the second blocks.

8. A memory controller for writing data continuously to a first and a second block provided by dividing a memory region of a nonvolatile memory, and for reading the data therefrom, comprising:
- a first writer writing data to the first block while a power source voltage is maintained at a constant level; and
- a second writer writing the same data to the second block as the data written to the first block, while the power source voltage is maintained at the constant level, after completion of the writing by the first writer and a lapse of a predetermined waiting time, the waiting time being longer than a period of time in which the power source voltage drops from a guaranteed writing level down to a disabled writing level disabling the writing of data to the memory region, wherein the data stored in the memory region is binary data, the first writer writing the data as intact to the first block, the second writer writing to the second block a data obtained by inverting each of the binary values of the data written by the first writer to the first block.

* * * * *